United States Patent
Ito et al.

(10) Patent No.: US 10,276,420 B2
(45) Date of Patent: Apr. 30, 2019

(54) ELECTROSTATIC CHUCK AND SEMICONDUCTOR MANUFACTURING APPARATUS

(71) Applicant: KABUSHIKI KAISHA TOSHIBA, Minato-ku, Tokyo (JP)

(72) Inventors: Shinya Ito, Ishikawa (JP); Hiroshi Sanda, Ishikawa (JP); Eiichi Nagumo, Ishikawa (JP); Makoto Saito, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 244 days.

(21) Appl. No.: 15/449,255

(22) Filed: Mar. 3, 2017

(65) Prior Publication Data
US 2018/0076080 A1  Mar. 15, 2018

(30) Foreign Application Priority Data
Sep. 15, 2016 (JP) .................. 2016-180341

(51) Int. Cl.
*H01L 21/683* (2006.01)
(52) U.S. Cl.
CPC .............. *H01L 21/6833* (2013.01)
(58) Field of Classification Search
CPC .................................................. H02N 13/00
USPC .......................................................... 361/234
See application file for complete search history.

(56) References Cited

U.S. PATENT DOCUMENTS

| 5,151,845 | A | 9/1992 | Watanabe et al. |
| 5,880,922 | A | 3/1999 | Husain |
| 6,431,112 | B1* | 8/2002 | Sill ........ H01J 37/321 118/723 E |
| 2011/0096461 | A1* | 4/2011 | Yoshikawa ..... H01L 21/6833 361/234 |
| 2012/0087058 | A1* | 4/2012 | Hansen ............. G03F 7/703 361/234 |

FOREIGN PATENT DOCUMENTS

| JP | 2838810 B2 | 12/1998 |
| JP | 2000-012194 A | 1/2000 |
| JP | 2000-021961 A | 1/2000 |

* cited by examiner

*Primary Examiner* — Dharti H Patel
(74) *Attorney, Agent, or Firm* — Foley & Lardner LLP

(57) ABSTRACT

An electrostatic chuck includes a first electrode provided in a first plane, a second electrode provided in a second plane parallel to the first plane, and an insulator. The second electrode includes a plurality of portions which intersect with an intersection line between a region in which the first electrode is orthogonally projected to the second plane and a third plane vertical to the second plane. The insulator is provided between the first and second electrodes.

10 Claims, 9 Drawing Sheets

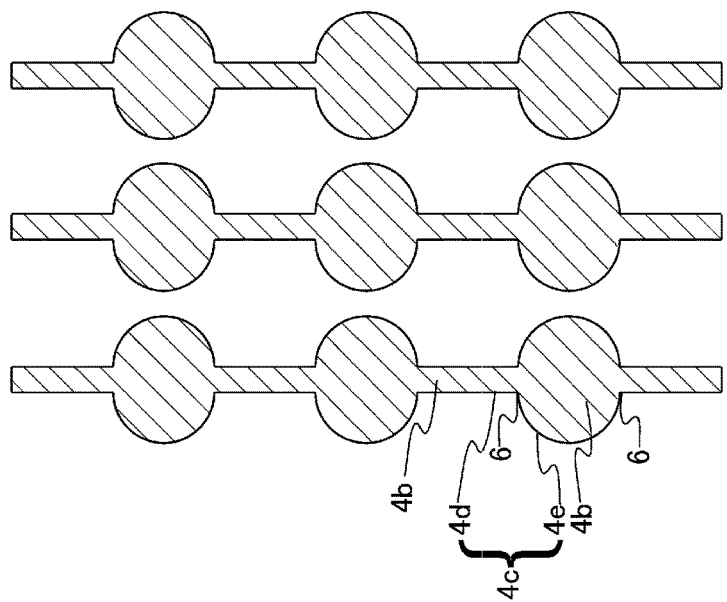
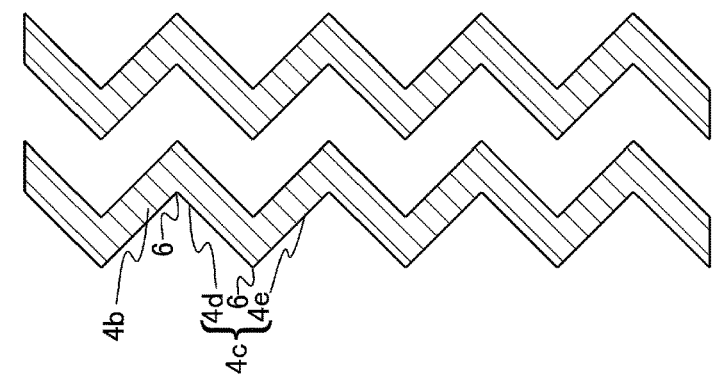
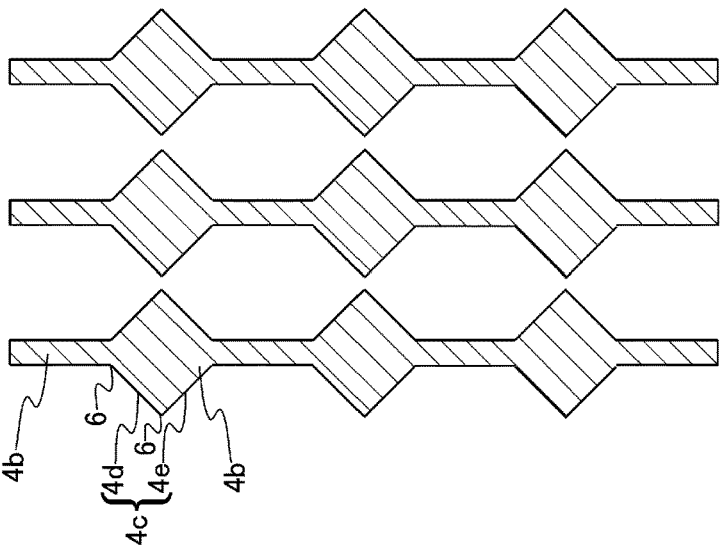

ELECTROSTATIC CHUCK AND SEMICONDUCTOR MANUFACTURING APPARATUS

CROSS-REFERENCE TO RELATED APPLICATION

This application claims the benefit of and priority to Japanese Patent Application No. 2016-180341, filed Sep. 15, 2016; the entire contents of which are incorporated herein by reference.

FIELD

Embodiments described herein relate generally to an electrostatic chuck and a semiconductor manufacturing apparatus.

BACKGROUND

In semiconductor manufacturing apparatuses, etching, sputtering, and the like can be performed in a state in which substrates such as wafers are fixed. Chucks are used as substrate fixing mechanisms.

Examples of chucks include mechanical chucks that mechanically fix substrates, vacuum chucks that adsorb substrates through vacuuming, and electrostatic chucks that adsorb substrates using electrostatic forces generated between the substrates and pedestals.

SUMMARY

In some embodiments according to one aspect, an electrostatic chuck may include a first electrode provided in a first plane, a second electrode provided in a second plane parallel to the first plane, and an insulator. The second electrode may include a plurality of portions which intersect with an intersection line between a region in which the first electrode is orthogonally projected to the second plane and a third plane vertical to the second plane. The insulator may be provided between the first and second electrodes.

In some embodiments according to another aspect, an electrostatic chuck may include a first electrode provided in a first plane, a second electrode provided in a second plane parallel to the first plane, and a substrate. The second electrode may be provided in a second plane parallel to the first plane and include a plurality of portions. Voltages applied to the first and second electrodes may be configured to generate dielectric polarization in the substrate such that adsorption force is generated by gradient force from the dielectric polarization and gradient with an intensity of an electric field generated between the second electrode and the first electrode.

Other aspects and embodiments of the disclosure are also encompassed. The foregoing summary and the following detailed description are not meant to restrict the disclosure to any particular embodiment but are merely meant to describe some embodiments of the disclosure.

DESCRIPTION OF THE DRAWINGS

FIGS. 5A, 5B and 5C are schematic diagrams illustrating second electrodes in an electrostatic chuck according to some embodiments.

DETAILED DESCRIPTION

Figure 1:
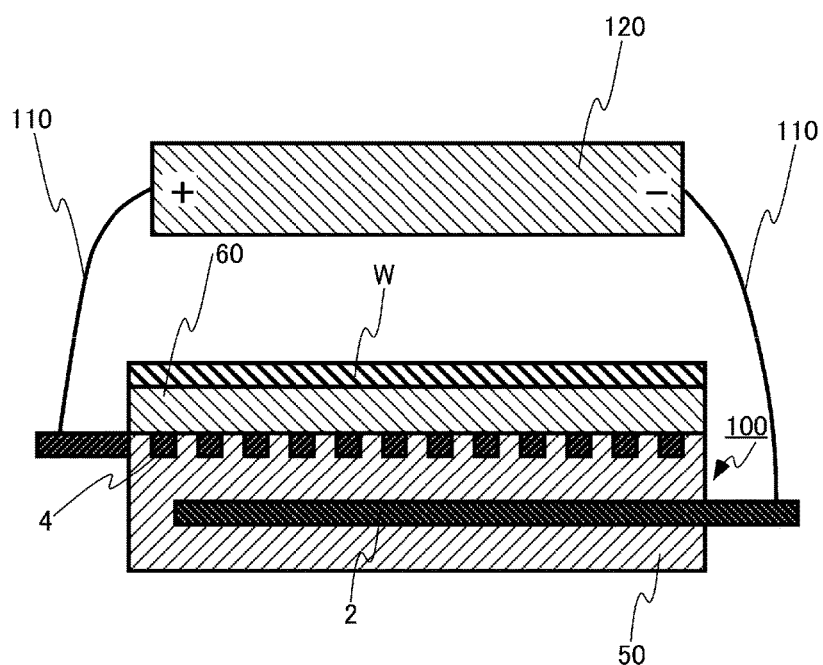
FIG. 1 is a schematic diagram illustrating an electrostatic chuck according to some embodiments.

An example embodiment provides an electrostatic chuck having a strong adsorption force and a semiconductor manufacturing apparatus that uses the electrostatic chuck having a strong adsorption force.

According to some embodiments, an electrostatic chuck includes a first electrode that is provided in a first plane, a second electrode that is provided in a second plane parallel to the first plane and includes a plurality of portions which intersect with an intersection line between a region in which the first electrode is orthogonally projected to the second plane and a third plane vertical to the second plane, and an insulator that is provided between the first and second electrodes.

Hereinafter, embodiments will be described with reference to the drawings.

In the present disclosure, the same reference numerals are given to the same or similar members and the repeated description thereof will not be made in some cases.

In the present disclosure, to indicate positional relations between components, an upper direction of the drawings is described as "top" and a lower direction of the drawings is "bottom". In the present disclosure, the concepts of "top" and "bottom" are not necessarily terms indicating a relation with gravity. By perpendicular or orthogonal, the terms can refer to precisely 90° as well as a range of variation of less than or equal to ±5° relative to 90°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element.

According to some embodiments, an electrostatic chuck includes a first electrode that is formed in a first plane, a second electrode that is formed in a second plane parallel to the first plane and includes a plurality of portions which intersect with an intersection line between a region in which the first electrode is orthogonally projected to the second plane and a third plane vertical to the second plane, and an insulator that is formed between the first and second electrodes.

Figure 2:
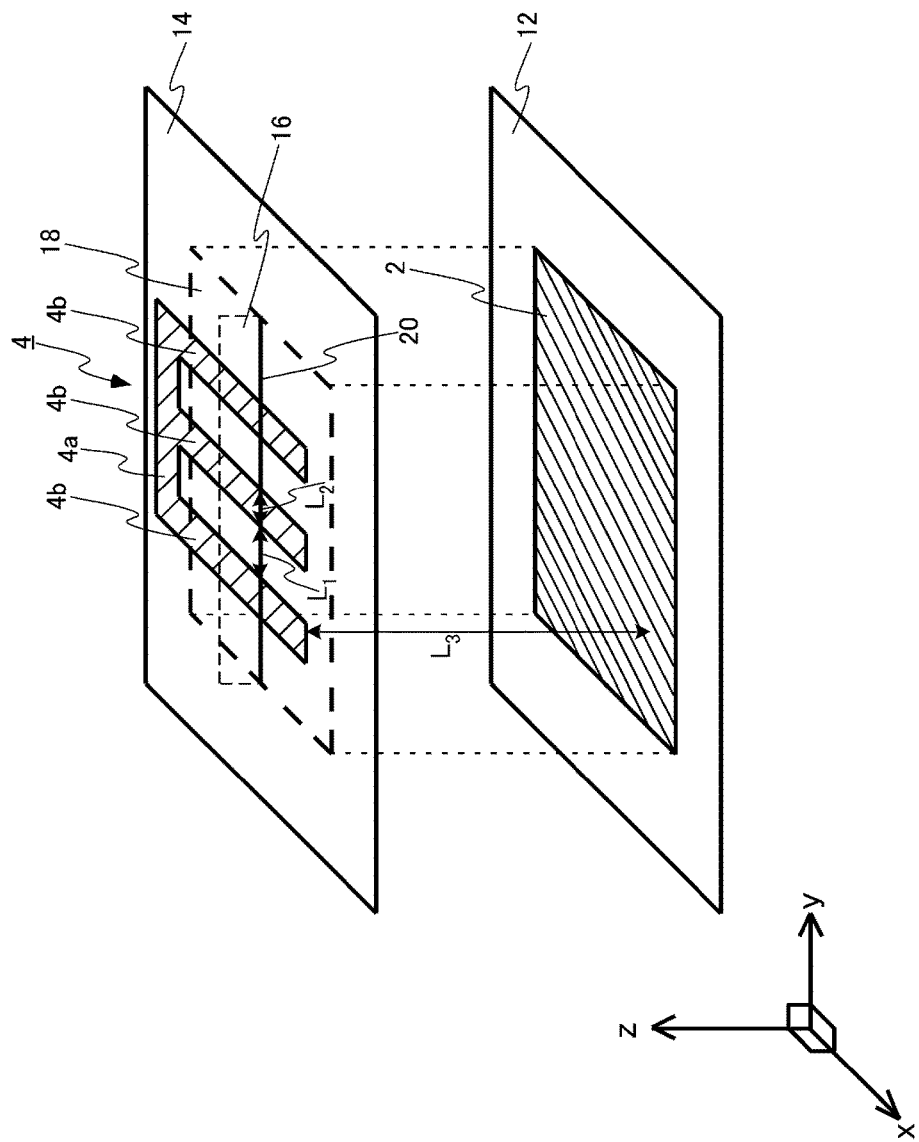
FIG. 2 is a schematic diagram illustrating main units of the electrostatic chuck according to some embodiments.

FIG. 1 is a schematic diagram illustrating an electrostatic chuck 100 according to some embodiments. FIG. 2 is a schematic diagram illustrating main units of the electrostatic chuck 100 according to some embodiments.

In some embodiments, the electrostatic chuck 100 includes a first electrode 2, second electrodes 4, an insulator 50, and a plate 60. The second electrode 4 includes a first portion 4a and second portions 4b.

In some embodiments, the first electrode 2 is formed in a first plane 12.

In some embodiments, the second electrodes 4 are formed in a second plane 14 that is parallel to the first plane 12. The second electrode 4 includes a plurality of portions which intersect with an intersection line 20 between (1) a region 18 in which the first electrode 2 is orthogonally projected to the second plane 14 and (2) a third plane 16 that is vertical to the first plane 12 and the second plane 14. The first plane 12, the second plane 14, and the third plane 16, and the intersection line 20 are all virtually formed.

Here, the X axis, the Y axis which is one axis vertical to the X axis, and the Z axis which is vertical to the X and Y axes will be defined. The first plane 12 and the second plane 14 are assumed to be planes parallel to a plane vertical to the Z axis, that is, the XY plane. In this case, the third plane 16 is a plane parallel to a plane vertical to the X axis, that is, the YZ plane. The intersection line 20 is a line vertical to the XZ plane, that is, a line parallel to the Y axis.

In some embodiments, the second electrode 4 includes the first portion 4a and the plurality of second portions 4b of which one end is electrically connected to the first portion 4a. The first portion 4a and the plurality of second portions 4b have, for example, a rectangular shape in the second plane 14. In some embodiments, the plurality of second portions 4b are arranged in the region 18 so that the second portions 4b are distant from each other by a constant distance L1. Thus, the plurality of second portions 4b intersect with the intersection line 20.

Figure 3:
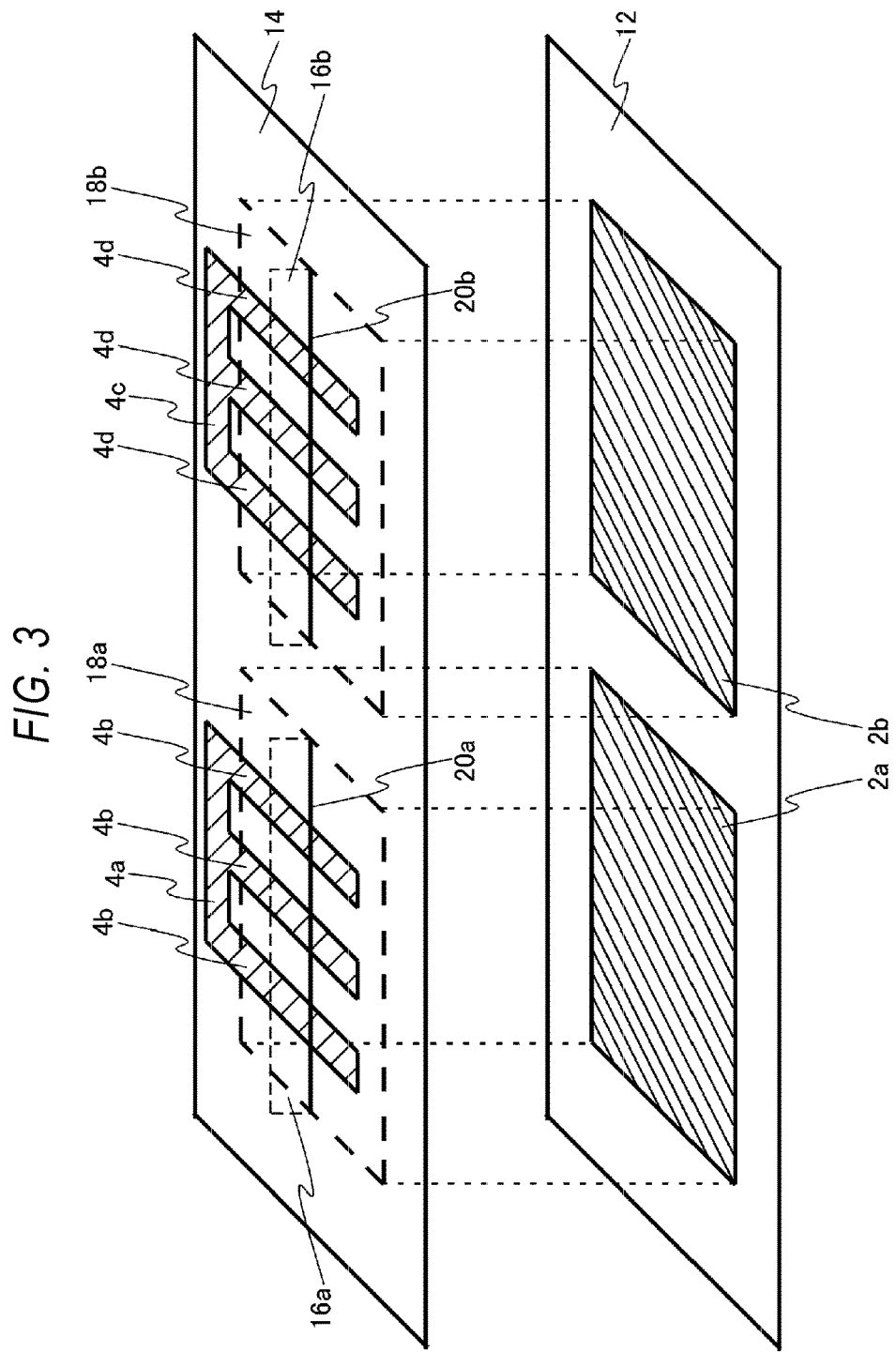
FIG. 3 is a schematic diagram illustrating main units of the electrostatic chuck according to some embodiments.

FIG. 3 is a schematic diagram illustrating main units of the electrostatic chuck 100 according to some embodiments. In some embodiments, the first electrode includes a first portion 2a and a second portion 2b. The second electrodes 4 include the first portion 4a, the second portions 4b, a third portion 4c, and fourth portions 4d. A region 18a in which the first portion 2a is orthogonally projected to the second plane 14 and a third plane 16a vertical to the second plane 14 form one intersection line 20a. A region 18b in which the second portion 2b is orthogonally projected to the second plane 14 and a third plane 16b vertical to the second plane 14 form one intersection line 20b. The plurality of second portions 4b intersect with one intersection line 20a. The plurality of second portions 4d intersect with one intersection line 20b.

In some embodiments, the shapes of the second electrodes 4 are not limited to the foregoing shapes.

In some embodiments, the first electrode 2 is formed using, for example, an aluminum (Al) foil. The second electrodes 4 can contain molybdenum (Mo), nickel (Ni), or gold (Au) so that the second electrodes 4 can be easily formed by deposition. However, the materials of the first and second electrodes are not limited thereto.

In some embodiments, the insulator 50 (see FIG. 1) is formed between the first electrode 2 and the second electrodes 4. The insulator 50 holds the first electrode 2 and the second electrodes 4 at an appropriate distance. The insulator 50 is, for example, a polyimide film, but is not necessarily limited thereto.

In some embodiments, a distance L1 between the second portions 4b on the intersection line 20 is equal to or greater than 1 mm and equal to or less than 3 mm, that is, 1 mm≤L1≤3 mm. In some embodiments, a length L2 of the second portion 4b on the intersection line 20 is equal to or greater than 0.5 mm and equal to or less than 1 mm, that is, 0.5 mm≤L2≤1 mm. In some embodiments, a distance L3 between the first electrode 2 and the second electrode 4 is equal to or greater than 25 μm and equal to or less than 70 μm, that is, 25 μm≤L3≤70 μm.

In some embodiments, the plate 60 (see FIG. 1) is arranged so that the second electrodes 4 are formed between the plate 60 and the insulator 50. The plate 60 is used to protect the second electrodes 4 and the insulator 50 of the electrostatic chuck against corrosion when the electrostatic chuck 100 is arranged in an environment in which plasma is generated in a corrosive gas atmosphere in a semiconductor manufacturing apparatus.

In some embodiments, the material of the plate 60 is determined based on a dielectric constant of the material of the plate 60. For example, ceramics such as aluminum nitride (AlN) is used as the plate 60.

In some embodiments, the film thickness of the plate 60 is equal to or greater than 0.6 mm and equal to or less than 2 mm. When the film thickness of the plate 60 is thicker than 2 mm, the distance between the second electrodes 4 and a substrate W may be too long. Therefore, it is difficult to transmit an electrostatic force with a sufficient magnitude to the substrate W and adsorb the substrate W. On the other hand, when the film thickness of the plate 60 is thinner than 0.6 mm, the film thickness may be considerably thin. Therefore, it is difficult to process the film thickness of the plate 60.

In some embodiments, the substrate W is, for example, a semiconductor substrate such as a silicon (Si) substrate.

As the substrate W, for example, a resin may be formed on a semiconductor substrate by coating or the like. In this case, the substrate W is fixed onto the plate 60 or without using the plate 60 so that the above-described resin is directly adsorbed onto the second electrodes 4. In some embodiments, the substrate W is a semiconductor substrate having a surface on which a conductive film is formed. The substrate W may be fixed so that the above-described conductive film is directly adsorbed onto the plate 60 or directly onto the second electrodes 4 without using the plate 60.

A power supply 120 is, for example, a commercially available high-voltage supply capable of applying a voltage of about ±1000 V. One pole of the power supply 120, for example, a negative pole, is connected to the first electrode 2 using a connection wiring 110. The other pole of the power supply 120, for example, a positive pole, is connected to the second electrode 4 using a connection wiring 110. Thus, in some embodiments, a voltage with negative polarity is applied to the first electrode 2 and a voltage with positive polarity is applied to the second electrodes 4. In other words, the polarity of the voltage applied to the first electrode 2 is different from the polarity of the voltage applied to the second electrodes 4. Connection of the negative and positive poles, and the first electrode 2 and the second electrodes 4 can be achieved using holes or the like (not illustrated) formed in the insulator 50. In some embodiments, the voltage with the positive polarity may be applied to the first electrode 2 and the voltage with the negative polarity may be applied to the second electrodes 4.

Next, a method of manufacturing the electrostatic chuck 100 according to some embodiments will be described. First, the second electrodes 4 may be formed by depositing Mo to a ceramics plate formed of, for example, AlN and having a film thickness of about 4 mm. Next, an Al foil forming the first electrode 2 may be interposed between two polyimide films. Next, the ceramics plate on which the second electrodes 4 are formed and the above-described two polyimide films may be superimposed so that the second electrodes 4 come into contact with the polyimide films, and may be hardened to be adhered by applying heat with a press machine. In some embodiments, the above-described polyimide films become the insulator 50. Next, the plate 60 may be formed by reducing the film thickness of the plate by about 3 mm so that the film thickness of the ceramics plate is about 1 mm. Thus, the electrostatic chuck 100 can be obtained.

Next, operational effects according to some embodiments will be described.

Figure 4A:
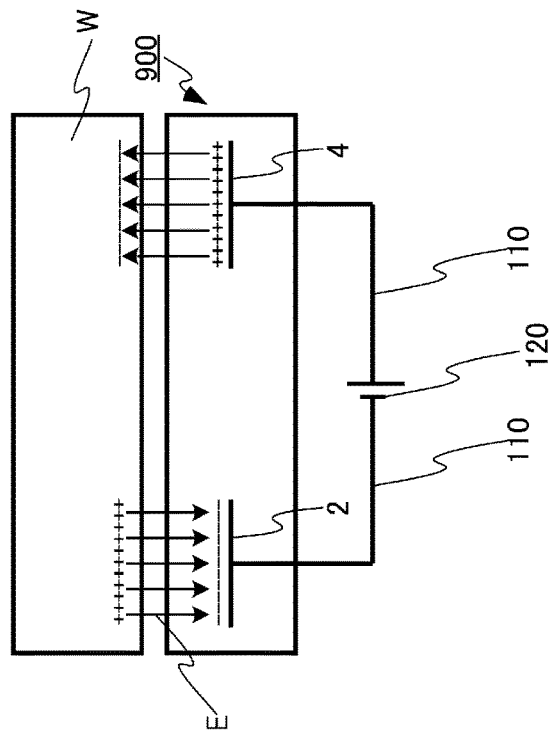
FIGS. 4A and 4B are schematic diagrams illustrating operational effects of the electrostatic chuck according to some embodiments.
Figure 4B:
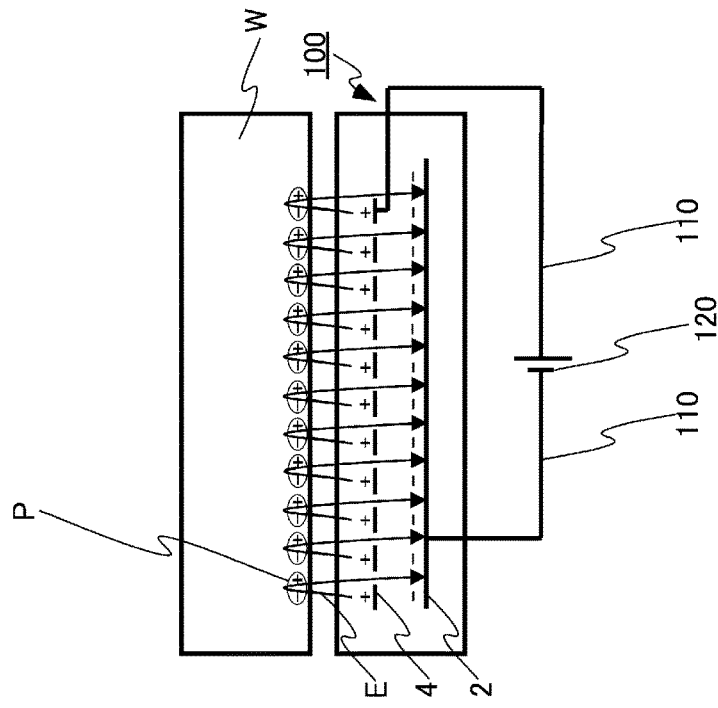

FIGS. 4A and 4B are schematic diagrams illustrating an operational effect according to some embodiments.

FIG. 4A is a schematic diagram illustrating an operational effect of an electrostatic chuck 900 as a comparative example. In the electrostatic chuck 900, a voltage with negative polarity is applied to the first electrode 2. Thus, the substrate W on the first electrode 2 is charged positively.

In the electrostatic chuck 900, a voltage with positive polarity is applied to the second electrodes 4. Thus, the substrate W on the second electrode 4 is charged negatively. Electric force lines E are generated and an adsorption force is generated in positively charged portions of the first electrode 2 and the substrate W and negatively charged portions of the second electrode 4 and the substrate W.

For example, when the substrate W is a semiconductor substrate, the number of free electrons in the substrate W is greater than that of an insulation material, and thus such electrification is relatively easily generated. Therefore, good adsorption is achieved. However, when the substrate W is formed of an insulation material such as a resin, there is no sufficient charge in the substrate. Therefore, it is difficult for the electrostatic chuck 900 as the comparative example to adsorb the substrate W formed of an insulation material.

When a resin is formed on a semiconductor substrate in regard to the substrate W, warpage of the substrate W may be increased after the resin is formed. Therefore, there is a problem that it is more difficult for the electrostatic chuck to adsorb the substrate.

FIG. 4B is a schematic diagram illustrating an operational effect of the electrostatic chuck 100 according to some embodiments. In the electrostatic chuck 100 according to some embodiments, a voltage with negative polarity is applied to the first electrode 2 and a voltage with positive polarity is applied to the second electrode 4. The electric force lines E generated from the second electrode 4 enter the substrate W and subsequently return to the electrostatic chuck 100, and thus pass between the second electrodes 4 and reach the first electrode 2. In some embodiments, adsorption force is generated by gradient force from dielectric polarization P generated in the substrate W and gradient with the intensity of an electric field generated between the second electrode 4 and the first electrode 2.

In some embodiments, when the density of the second electrode 4 is increased in the electrostatic chuck 100, the number of electric force lines E generated from the second electrode 4 and going into/out from the substrate W increases, an adsorption force is generated between more dielectric polarization P and electric force lines E. In some embodiments, even when the substrate W is formed of an insulation material such as a resin by such a structure or is formed such that a resin is formed on the semiconductor substrate, the adsorption can be performed excellently by the electrostatic chuck 100.

In some embodiments, even when the substrate W is a semiconductor substrate or a semiconductor substrate having a surface on which a conductive film is formed, the adsorption can, of course, be performed excellently by the electrostatic chuck 100.

When L1 is greater than 3 mm, the more second portions 4b may not be formed in the region 18. Therefore, it is difficult to obtain a gradient force. On the other hand, when L1 is less than 1 mm, interference of charges occurs and the adsorption force may be weakened. In addition, due to the interference, there is a concern of the electrodes being broken by heat. Therefore, in some embodiments, the distance L satisfies 1 mm≤L1≤3 mm.

When L2 is greater than 1 mm, the more second portions 4b may not be formed in the region 18. Therefore, it is difficult to obtain a gradient force. On the other hand, when L2 is less than 0.5 mm, interference of charges occurs and the adsorption force may be weakened. In addition, due to the interference, there is a concern of the electrodes being broken by heat. Therefore, in some embodiments, the distance L2 satisfies 0.5 mm≤L2≤1 mm.

When L3 is greater than 70 μm, the distance between the first electrode 2 and the second electrode 4 may be considerably lengthened and a gradient force may not be transmitted to the substrate W. Therefore, a force adsorbing the substrate W may be weakened. On the other hand, when L3 is equal to or less than 25 μm, interference of charges occurs and the adsorption force may be weakened. In addition, due to the interference, there is a concern of the electrodes being broken by heat. Therefore, In some embodiments, to the distance L3 satisfies 25 μm≤L3≤70 μm.

As described above, with the electrostatic chuck according to some embodiments, it is possible to provide an electrostatic chuck having a strong adsorption force.

An electrostatic chuck according to some embodiments is different from the electrostatic chuck of the embodiments illustrated in FIGS. 1-4B in that an end of a second electrode in a region has a vertex. Here, the repeated content according to the above-described embodiments will not be described.

FIGS. 5A to 5C are schematic diagrams illustrating the second portions 4b of the second electrodes 4 in an electrostatic chuck 100 according to some embodiments.

In FIG. 5A, in some embodiments, a vertex 6 is formed in a portion of the second portion 4b. Here, the vertex 6 refers to a point at which two lines intersect with each other. In FIG. 5A, in some embodiments, a point at which a line 4d forming an end 4c and a line 4e forming the end 4c intersect each other is the vertex 6. In this way, by realizing the structure in which the end 4c has the vertex 6, it is possible to increase the density of the electric force lines E. Therefore, it is possible to obtain a stronger adsorption force.

In FIG. 5B, in some embodiments, the second portion 4b has a wave shape. In FIG. 5C, in some embodiments, a portion of the end 4c of the second portion 4b has an arc. In both of FIGS. 5B and 5C, since the vertex 6 is also formed, it is possible to obtain a stronger adsorption force.

As described above, with the electrostatic chuck according to some embodiments, it is possible to provide an electrostatic chuck having a stronger adsorption force.

An electrostatic chuck according to some embodiments is different from the electrostatic chucks according to the embodiments illustrated in FIGS. 1-5C in that a second electrode in a region has a hole. Here, the repeated content according to the embodiments illustrated in FIGS. 1-5C will not be described.

Figure 6:
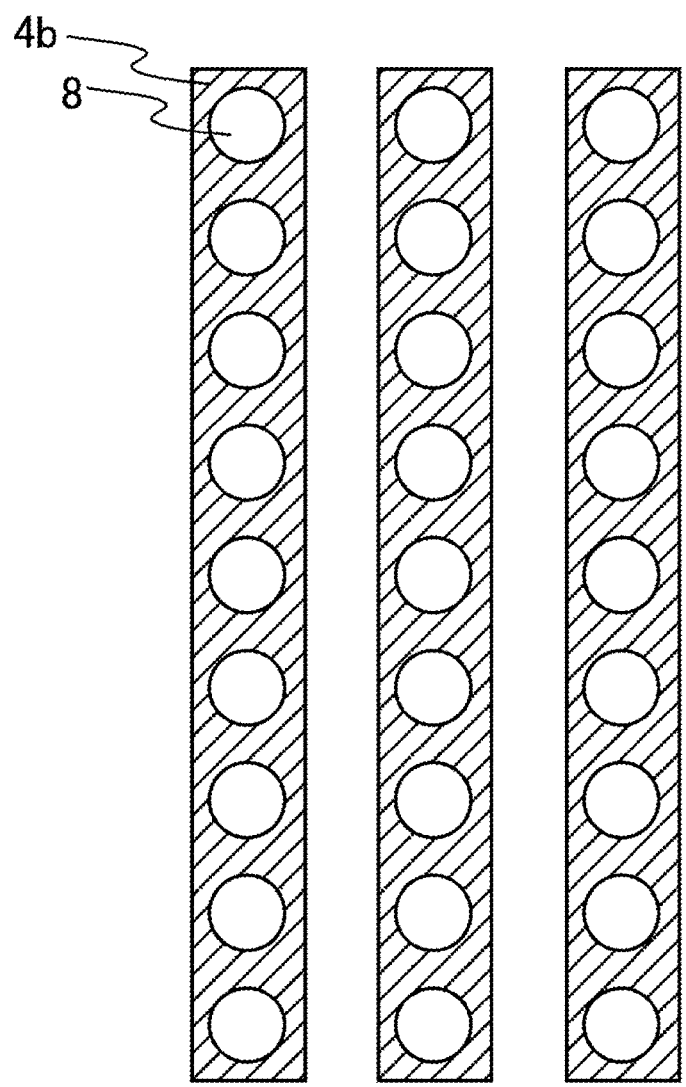
FIG. 6 is a schematic diagram illustrating a second electrode in an electrostatic chuck according to some embodiments.

FIG. 6 is a schematic diagram illustrating the second portions 4b of the second electrode 4 in an electrostatic chuck 100 according to some embodiments. In some embodiments, holes 8 are formed in the second portion 4b. Even in this case, since the density of the electric force lines E can be increased, it is possible to obtain a stronger adsorption force.

As described above, with the electrostatic chuck according to some embodiments, it is possible to provide an electrostatic chuck having a stronger adsorption force.

A semiconductor manufacturing apparatus according to some embodiments is a plasma processing apparatus that includes the electrostatic chuck according to the embodiments illustrated in FIGS. 1-6. Here, the repeated content of the embodiments illustrated in FIGS. 1-6 will not be described.

Figure 7:
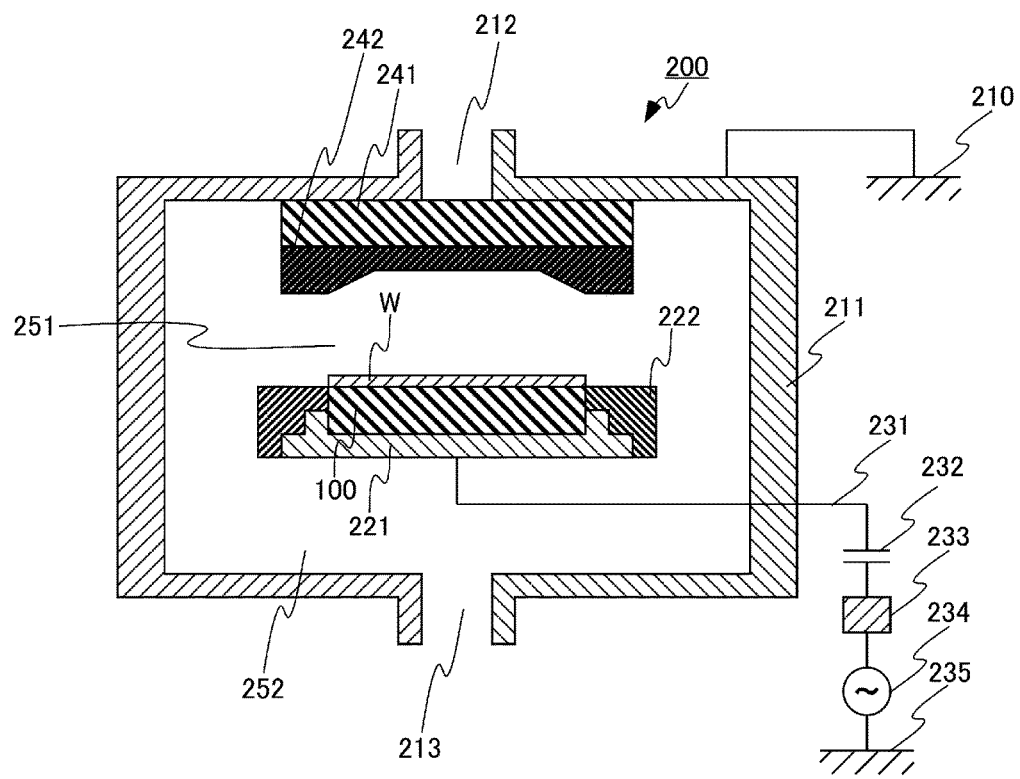
FIG. 7 is a schematic diagram illustrating a plasma processing apparatus which is an example of a semiconductor manufacturing apparatus according to some embodiments.

FIG. 7 is a schematic diagram illustrating a plasma processing apparatus 200 which is a semiconductor manufacturing apparatus according to some embodiments. Here, a reactive ion etching (RIE) apparatus is exemplified as the plasma processing apparatus 200. In some embodiments, the plasma processing apparatus 200 includes a chamber 211 formed of, for example, aluminum and configured to be airtight. In some embodiments, the chamber 211 is grounded by a ground 210.

In some embodiments, in the chamber 211, a support table 221 that horizontally supports the substrate W and functions as a lower electrode is provided. The electrostatic chuck 100 is provided on the surface on the support table 221. The electrostatic chuck 100 is connected to a power supply (not illustrated) by a wiring (not illustrated). An insulation ring 222 is provided to cover the circumferences of side and bottom surfaces of the support table 221.

In some embodiments, the support table 221 is fixed by a support unit (not illustrated) supported by the chamber 211 so that the support table 221 is located near a center inside the chamber 211 (e.g., closer to the center than a boundary of the chamber 211). Further, a feeding line 231 supplying high-frequency power is connected to the support table 221, and a blocking capacitor 232, a matching circuit 233, a high-frequency power supply 234 are connected to the feeding line 231. The high-frequency power with a predetermined frequency can be supplied from the high-frequency power supply 234 (which is also grounded by a ground 235) to the support table 221.

In some embodiments, an upper electrode 242 is provided in an upper portion of the support table 221 to face the support table 221 functioning as the lower electrode. The upper electrode 242 is fixed to a component 241 near an upper portion of the chamber 211 distant from the support table 221 by a predetermined distance so that the upper electrode 242 faces the support table 221 in parallel. By such a structure, the upper electrode 242 and the support table 221 can configure a pair of parallel flat electrodes. In some embodiments, a plurality of gas supply paths (not illustrated) penetrating through the plate of the upper electrode 242 in its thickness direction can be formed in the inner edge portion of the upper electrode 242. In some embodiments, the upper electrode 242 has, for example, a circular shape. In some embodiments, the upper electrode 242 is an electrode formed of, for example, silicon.

In some embodiments, a gas supply port 212 to which a processing gas used at the time of plasma processing is supplied is formed near the upper portion of the chamber 211 (e.g., closer to the upper portion of the chamber 211 than a center inside the chamber 211). In some embodiments, a gas supply apparatus (not illustrated) is connected to the gas supply port 212 via a pipe line.

In some embodiments, a gas exhaust port 213 is formed in a lower portion of the support table 221. In some embodiments, a vacuum pump (not illustrated) is connected to the gas exhaust port 213 via a pipe line.

In some embodiments, a space between the support table 221 and the upper electrode 242 inside the chamber 211 serves as a plasma processing chamber 251. In some embodiments, a space of a lower portion between the support table 221 and the bottom surface of the chamber 211 serves as a gas exhaust chamber 252.

In some embodiments, at the time of etching such as the RIE, temperature of the substrate W during etching can be uniform The substrate W is tightly adsorbed by the electrostatic chuck 100 by using the electrostatic chuck 100 according to the embodiments illustrated in FIGS. 1-6. Therefore, the temperature of the entire substrate W can be easily controlled to the temperature of the electrostatic chuck 100. Therefore, by controlling the temperature of the electrostatic chuck 100, it is possible to perform excellent etching.

The RIE apparatus has been described above, but the electrostatic chuck 100 according to the embodiments illustrated in FIGS. 1-6 also can be used for other semiconductor manufacturing apparatuses such as a plasma chemical vapor deposition (CVD) apparatus, a sputtering apparatus, a metal organic chemical vapor deposition (MOCVD) apparatus, a mask drawing apparatus, and a mask inspection apparatus.

By the semiconductor manufacturing apparatus according to some embodiments, it is possible to provide a semiconductor manufacturing apparatus using an electrostatic chuck having a strong adsorption force.

A semiconductor manufacturing apparatus according to some embodiments is an inspection apparatus that includes the electrostatic chuck according to the embodiments illustrated in FIGS. 1-6. Here, the repeated content of the embodiments illustrated in FIGS. 1-6 will not be described.

Figure 8:
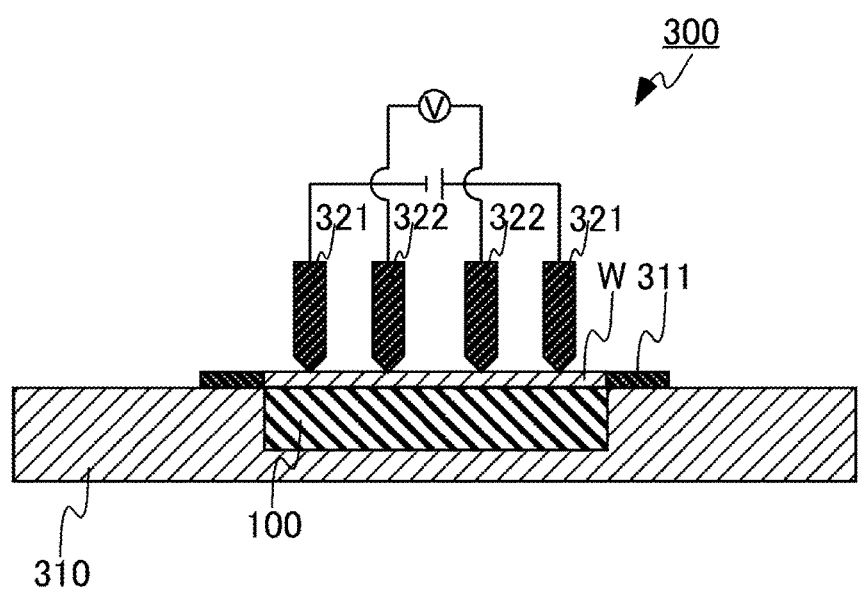
FIG. 8 is a schematic diagram illustrating an inspection apparatus which is an example of the semiconductor manufacturing apparatus according to some embodiments.

FIG. 8 is a schematic diagram illustrating an inspection apparatus 300 which is a semiconductor manufacturing apparatus according to some embodiments.

In some embodiments, the inspection apparatus 300 includes an inspection stage 310, current terminals 321, and voltage terminals 322. The electrostatic chuck 100 is provided on the surface of the inspection stage 310. The substrate W in which an inspection object (not illustrated) is formed is fixed onto the inspection stage 310 by the electrostatic chuck 100. By bringing the current terminals 321 and the voltage terminals 322 in contact with the inspection object, it is possible to inspect electric characteristics of the inspection object.

By the semiconductor manufacturing apparatus according to some embodiments, it is possible to provide a semiconductor manufacturing apparatus using an electrostatic chuck having a strong adsorption force.

A semiconductor manufacturing apparatus according to some embodiments is a pincette that includes the electrostatic chuck according to the embodiments illustrated in FIGS. 1-6. Here, the repeated content according to the embodiments illustrated in FIGS. 1-6 will not be described.

Figure 9:
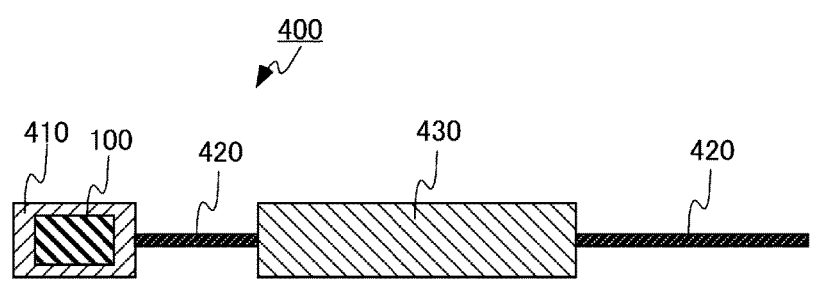
FIG. 9 is a schematic diagram illustrating a pincette which is an example of the semiconductor manufacturing apparatus according to some embodiments.

FIG. 9 is a schematic diagram illustrating a pincette 400 which is a semiconductor manufacturing apparatus according to some embodiments. The electrostatic chuck 100 is provided at a front end 410 of the pincette 400, and thus a substrate can be adsorbed. In some embodiments, a wiring 420 is connected to a power supply (not illustrated), and thus electricity is supplied to the electrostatic chuck 100 through the wiring 420. In some embodiments, supply of electricity to the electrostatic chuck 100 may be controlled by disposing a switch (not illustrated) in a handle 430.

By the semiconductor manufacturing apparatus according to some embodiments, it is possible to provide a semiconductor manufacturing apparatus using an electrostatic chuck having a strong adsorption force.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the inventive concept.

What is claimed is:

1. An electrostatic chuck comprising:
   a first electrode that is provided in a first plane;
   a second electrode that is provided in a second plane parallel to the first plane and includes a plurality of portions which intersect with an intersection line between a region in which the first electrode is orthogonally projected to the second plane and a third plane vertical to the second plane; and
   an insulator that is provided between the first and second electrodes.

2. The electrostatic chuck according to claim 1,
   wherein a distance between the portions on the intersection line is equal to or greater than 1 mm and equal to or less than 3 mm,
   lengths of the portions on the intersection line are equal to or greater than 0.5 mm and equal to or less than 1 mm, and
   a distance between the first electrode and the second electrode is equal to or greater than 25 μm and equal to or less than 70 μm.

3. The electrostatic chuck according to claim 1,
   wherein polarity of a voltage applied to the first electrode is different from polarity of a voltage applied to the second electrode.

4. The electrostatic chuck according to claim 1, further comprising:
   a plate,
   wherein the second electrode is provided between the plate and the insulator.

5. The electrostatic chuck according to claim 1,
   wherein an end of the second electrode in the region has a vertex.

6. The electrostatic chuck according to claim 1,
   wherein the second electrode in the region has a hole.

7. A semiconductor manufacturing apparatus comprising:
   a chamber; and
   the electrostatic chuck according to claim 1 disposed in the chamber.

8. An electrostatic chuck comprising:
   a first electrode that is provided in a first plane;
   a second electrode that is provided in a second plane spaced from the first plane and includes a plurality of portions;
   a substrate; and
   a power supply connected to the first and second electrodes,
   wherein voltages applied to the first and second electrodes are configured to generate dielectric polarization in the substrate such that adsorption force is generated by gradient force from the dielectric polarization and gradient with an intensity of an electric field generated between the second electrode and the first electrode.

9. The electrostatic chuck according to claim 8, wherein in applying the voltages to the first and second electrodes, a voltage with negative polarity is applied to the first electrode and a voltage with positive polarity is applied to the second electrode.

10. The electrostatic chuck according to claim 8, wherein in generating the dielectric polarization, electric force lines is generated from the second electrode, and the generated electric force lines enters the substrate, subsequently returns to the electrostatic chuck, passes between the second electrodes, and reaches the first electrode.

* * * * *